United States Patent
Samson et al.

(10) Patent No.: US 10,050,610 B2
(45) Date of Patent: Aug. 14, 2018

(54) CLOCK DISTRIBUTION SCHEMES WITH WIDE OPERATING VOLTAGE RANGES

(71) Applicant: QUALCOMM Incorporated, San Diego, CA (US)

(72) Inventors: Giby Samson, San Diego, CA (US); Yu Pu, San Diego, CA (US); Kendrick Hoy Leong Yuen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 265 days.

(21) Appl. No.: 14/642,859

(22) Filed: Mar. 10, 2015

(65) Prior Publication Data
US 2016/0269009 A1 Sep. 15, 2016

(51) Int. Cl.
| | |
|---|---|
| *G06F 1/10* | (2006.01) |
| *H03K 5/135* | (2006.01) |
| *H03K 19/00* | (2006.01) |
| *H03K 5/00* | (2006.01) |

(52) U.S. Cl.
CPC .............. *H03K 5/135* (2013.01); *G06F 1/10* (2013.01); *H03K 19/0016* (2013.01); *H03K 2005/00052* (2013.01)

(58) Field of Classification Search
CPC ................. G06F 1/10; H03K 19/0016; H03K 2005/00052; H03K 5/135
See application file for complete search history.

(56) References Cited

U.S. PATENT DOCUMENTS

| | | |
|---|---|---|
| 6,404,237 B1 | 6/2002 | Mathew et al. |
| 6,882,182 B1 | 4/2005 | Conn et al. |
| 6,886,146 B2 | 4/2005 | Hsu |
| 7,162,705 B2 | 1/2007 | Chaudhari |
| 7,230,876 B2 | 6/2007 | Walker |
| 7,898,286 B2 | 3/2011 | Arsovski et al. |
| 7,917,875 B1 | 3/2011 | Johnston |
| 8,146,039 B2 | 3/2012 | Shah |
| 8,704,576 B1 | 4/2014 | Bucelot et al. |
| 8,793,630 B2 | 7/2014 | Ge et al. |
| 9,443,053 B2 * | 9/2016 | Jayakumar .......... G06F 17/5077 |
| 2004/0017242 A1 * | 1/2004 | Lee ........................... G06F 1/10 327/293 |

(Continued)

FOREIGN PATENT DOCUMENTS

EP 2765474 A1 8/2014

OTHER PUBLICATIONS

International Search Report and Written Opinion for PCT/US2016/020330, dated Jul. 6, 2016, 13 pages.

(Continued)

*Primary Examiner* — Abdelmoniem Elamin
(74) *Attorney, Agent, or Firm* — Withrow & Terranova, PLLC

(57) ABSTRACT

Clock distribution schemes with wide operating voltage ranges are disclosed. In one aspect, an operating voltage level or condition within a computing device is sensed. In a first voltage condition, delay elements are used within a clock tree to minimize clock skew. In a second voltage condition, one or more delay and/or clocked elements are bypassed to minimize clock skew at the second voltage condition. In addition to controlling clock skew, power may be conserved by depowering the bypassed elements. Controlling clock skew in this fashion improves operation of a computing device that includes the clock tree and may improve battery life.

24 Claims, 10 Drawing Sheets

(56) References Cited

U.S. PATENT DOCUMENTS

| | | | |
|---|---|---|---|
| 2005/0264316 A1* | 12/2005 | Atkinson | G06F 13/4072 326/30 |
| 2007/0033427 A1 | 2/2007 | Correale, Jr. et al. | |
| 2011/0279159 A1* | 11/2011 | Lin | H03K 5/1565 327/175 |
| 2012/0054530 A1 | 3/2012 | Schuttenberg et al. | |
| 2013/0219352 A1 | 8/2013 | Ishikawa et al. | |
| 2014/0062564 A1 | 3/2014 | Sathe et al. | |
| 2014/0225645 A1* | 8/2014 | Sharma | G06F 1/10 326/98 |
| 2015/0026490 A1 | 1/2015 | Nieh et al. | |
| 2015/0186589 A1* | 7/2015 | Jayakumar | G06F 17/5077 716/119 |
| 2015/0310153 A1 | 10/2015 | Taskin et al. | |
| 2016/0267214 A1 | 9/2016 | Lim et al. | |

OTHER PUBLICATIONS

International Preliminary Report on Patentability for PCT/US2016/020330, dated Feb. 17, 2017, 19 pages.

Jacquet, D. et al., "A 3 GHz Dual Core Processor ARM Cortex-A9 in 28 nm UTBB FD-SOI CMOS With Ultra-Wide Voltage Range and Energy Efficiency Optimization," IEEE Journal of Solid-State Circuits, vol. 49, No. 4, Apr. 2014, IEEE, pp. 812-826.

Kim, J. et al., "An Optimal Algorithm of Adjustable Delay Buffer Insertion for Solving Clock Skew Variation Problem," 2013 50th ACM/EDAC/IEEE Design Automation Conference (DAC), May 29-Jun. 7, 2013, Austin, TX, IEEE, 6 pages.

Lim, K. et al., "An Optimal Allocation Algorithm of Adjustable Delay Buffers and Practical Extensions for Clock Skew Optimization in Multiple Power Mode Designs," IEEE Transactions on Computer-Aided Design of Integrated Circuits and Systems, vol. 32, No. 3, Mar. 2013, IEEE, pp. 392-405.

Tolbert, J. et al., "Analysis and Design of Energy and Slew Aware Subthreshold Clock Systems," IEEE Transactions on Computer-Aided Design of Integrated Circuits and Systems, vol. 30, No. 9, Sep. 2011, IEEE, pp. 1349-1358.

Tu, W. et al., "Low-Power Timing Closure Methodology for Ultra-Low Voltage Designs," 2013 IEEE/ACM International Conference on Computer-Aided Design (ICCAD), Nov. 18-21, 2013, San Jose, CA, IEEE, pp. 697-704.

Zhao, X. et al., "Variation-Aware Clock Network Design Methodology for Ultralow Voltage (ULV) Circuits," IEEE Transactions on Computer-Aided Design of Integrated Circuits and Systems, vol. 31, No. 8, Aug. 2012, IEEE, pp. 1222-1234.

\* cited by examiner

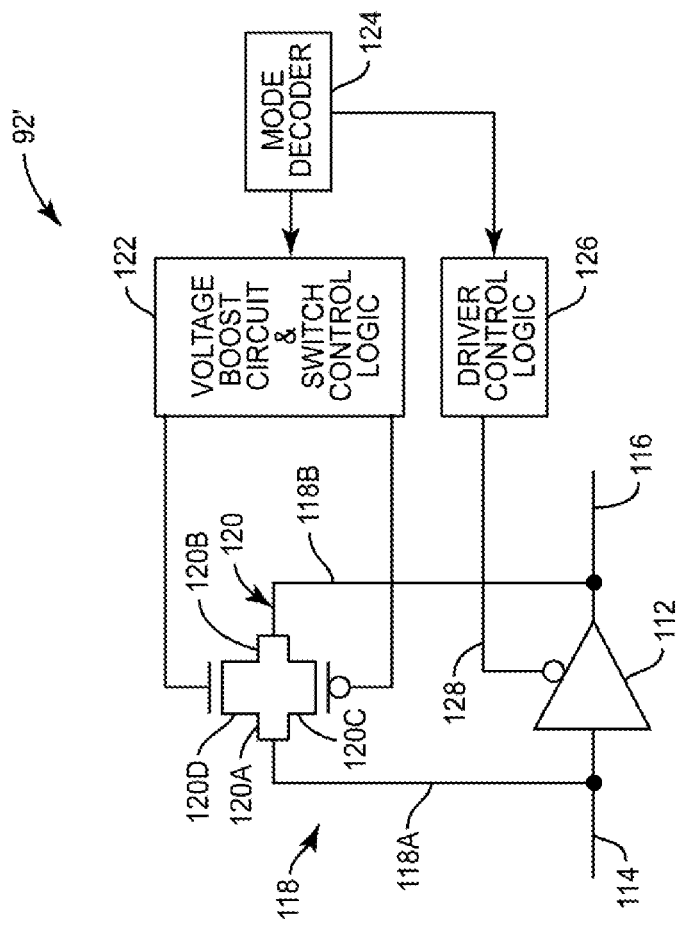
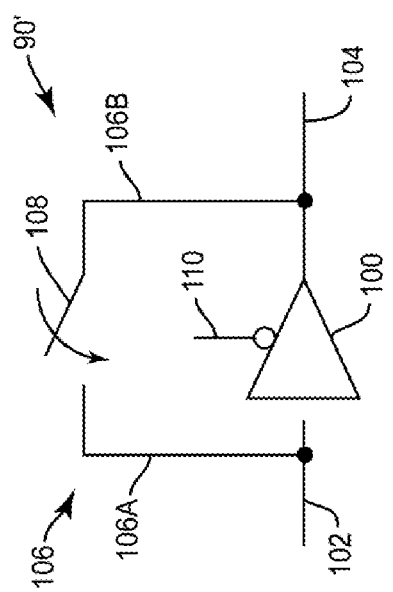
FIG. 4B
FIG. 4A

CLOCK DISTRIBUTION SCHEMES WITH WIDE OPERATING VOLTAGE RANGES

BACKGROUND

I. Field of the Disclosure

The technology of the disclosure relates generally to reducing clock skew in an integrated circuit (IC).

II. Background

Computing devices, and particularly mobile communication devices, have become common in current society. The prevalence of these computing devices is driven in part by the many functions that are now enabled on such devices. Demand for such functions increases processing capability requirements and generates a need for more complex circuits. While it is possible that some of this circuitry may function asynchronously, in many cases the circuitry requires (or at least benefits from) a common clock signal. The common clock signal and associated clock sinks may be referred to and represented as a clock tree.

As the number of elements requiring a common clock signal increases, the physical distance between a clock source and a given clock sink may increase, requiring long conductors, which in turn leads to delay in arrival of the clock signal. Complicating matters is the fact that different sinks may be different distances from the clock source. The different distances mean that the clock signal will arrive at the sinks at different times. This difference is sometimes referred to as clock skew. Clock skew is of concern because it reduces the effective clock period available for computation.

While the majority of clock skew comes from different clock paths within the clock tree, some additional clock skew may arise from process variations between elements. Adding to the difficulty in circuit design is the advent of devices that operate at widely varying voltages. For example, wearable internet devices may have very low power modes to extend battery life, but may also have an active mode with substantially larger voltages. Clock trees optimized for operation at a first voltage may have different clock skews at a second voltage. Accordingly, there remains a need to be able to address clock distribution and clock skew at wide operating voltage ranges.

SUMMARY OF THE DISCLOSURE

Aspects disclosed in the detailed description include clock distribution schemes with wide operating voltage ranges. In particular, exemplary aspects of the present disclosure contemplate sensing an operating voltage level or condition. In a first voltage condition, delay elements are used within a clock tree to minimize clock skew. In a second voltage condition, one or more delay and/or clocked elements are bypassed to minimize clock skew at the second voltage condition. In addition to controlling clock skew, power may be conserved by depowering the bypassed elements. Controlling clock skew in this fashion improves operation of a computing device that includes the clock tree and may improve battery life.

In this regard in one aspect, a method of controlling a clock tree within a computing device is disclosed. The method comprises determining a first voltage condition of an integrated circuit (IC) device from among a plurality of voltage conditions. The method also comprises, while the first voltage condition is valid, using a first clock tree configuration to minimize clock skew for a clock tree of the IC device. The method also comprises determining a second voltage condition from among the plurality of voltage conditions. The method also comprises bypassing a clocked cell within the clock tree to generate a second clock tree configuration while in the second voltage condition. The method also comprises depowering the clocked cell while in the second voltage condition.

In another aspect, an IC is disclosed. The IC comprises a clock tree formed from a plurality of clocked elements. The IC also comprises at least one bypass switch associated with at least one of the plurality of clocked elements. The IC also comprises a control system operatively coupled to the at least one bypass switch. The control system is configured to control operation of the IC at a first voltage condition among a plurality of voltage conditions. The control system is also configured to, while the first voltage condition is valid, use a first clock tree configuration to minimize clock skew for the clock tree of the IC. The control system is also configured to cause a transition to a second voltage condition from among the plurality of voltage conditions. The control system is also configured to cause the at least one bypass switch to bypass the at least one of the plurality of clocked elements when in the second voltage condition. The control system is also configured to depower bypassed clocked elements while in the second voltage condition.

In another aspect, an IC is disclosed. The IC comprises a clock tree formed from a plurality of clocked elements. The IC also comprises at least one means for bypassing at least one of the plurality of clocked elements. The IC also comprises a control system operatively coupled to the at least one means for bypassing. The control system is configured to control operation of the IC at a first voltage condition among a plurality of voltage conditions. The control system is also configured to, while the first voltage condition is valid, use a first clock tree configuration to minimize clock skew for the clock tree of the IC. The control system is also configured to cause a transition to a second voltage condition from among the plurality of voltage conditions. The control system is also configured to cause at least one bypass switch to bypass the at least one of the plurality of clocked elements when in the second voltage condition. The control system is also configured to depower bypassed clocked elements while in the second voltage condition.

BRIEF DESCRIPTION OF THE FIGURES

FIGS. 4A and 4B illustrate exemplary switches and control elements for use with the bypass able elements of FIG. 3;

DETAILED DESCRIPTION

Figure 1A:
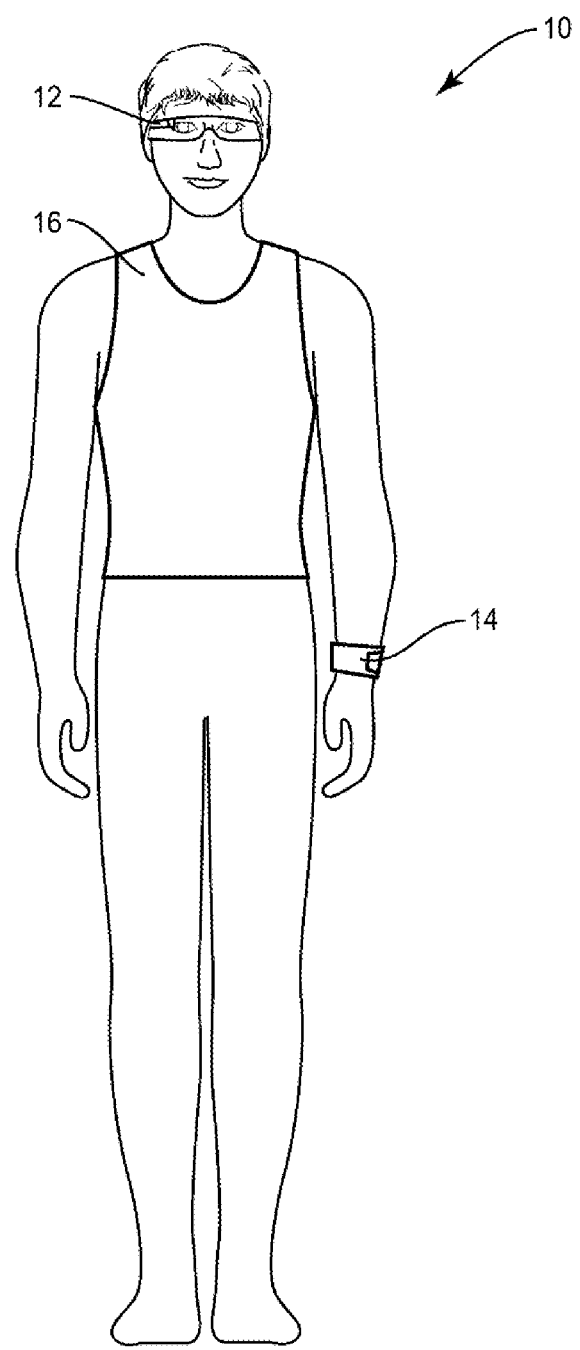
FIG. 1A is a simplified illustration of an individual wearing multiple computing devices.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include clock distribution schemes with wide operating voltage ranges. In particular, exemplary aspects of the present disclosure contemplate sensing an operating voltage level or condition. In a first voltage condition, delay elements are used within a clock tree to minimize clock skew. In a second voltage condition, one or more delay and/or clocked elements are bypassed to minimize clock skew at the second voltage condition. In addition to controlling clock skew, power may be conserved by depowering the bypassed elements. Controlling clock skew in this fashion improves operation of a computing device that includes the clock tree and may improve battery life.

Pressure to enable integrated circuits (ICs) that operate in multiple voltage modes (i.e., under multiple voltage constraints) is increasing as a function of the advent of Internet of Things (IoT) and wearable computing devices. Such devices typically have multiple modes, including a lower performance mode during which relatively low voltages are used (i.e., a low voltage constraint), and a higher performance mode during which relatively high voltages are used (i.e., a high voltage constraint). In this regard, FIG. 1A illustrates an individual 10 wearing multiple computing devices including computing eyeglasses 12 (e.g., GOOGLE® GLASS™), a computing watch 14 (e.g., APPLE® iWATCH™), and a computing shirt 16 (e.g., RALPH LAUREN® SMART SHIRT™). Each computing device (i.e., 12, 14, and 16) has at least one IC therein which may, by design, operate with at least two voltage conditions (e.g., active and standby).

Figure 1B:
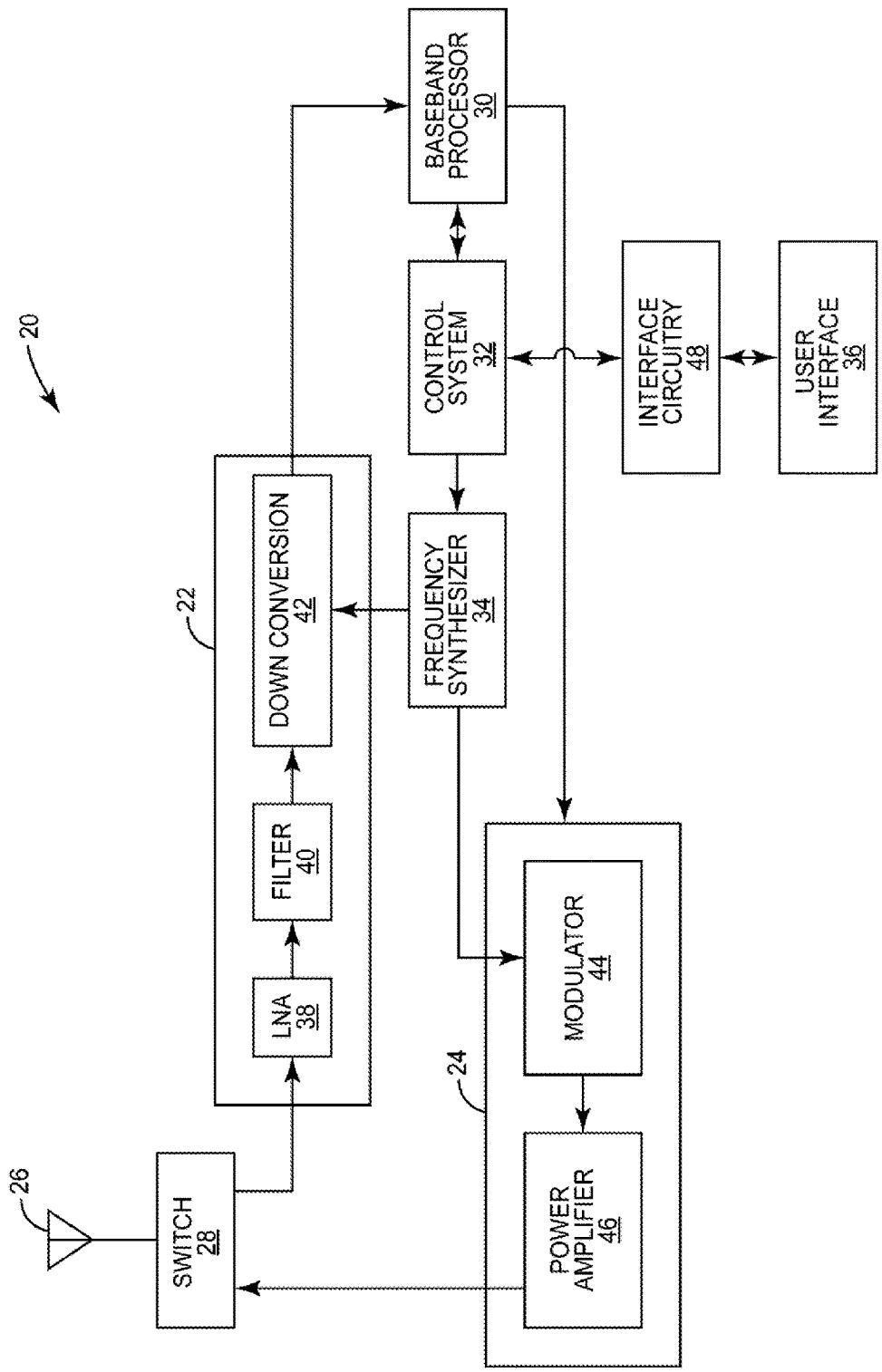
FIG. 1B is a simplified block diagram of a mobile computing device having multiple integrated circuits (ICs) that may use different voltage conditions.

While IoT are particularly prone to using at least two voltage conditions, other devices that contain high performance chips or ICs often have multiple performance (voltage) modes as well so that the ICs can remain within their thermal design power and prevent damage to the ICs from excessive heat. Likewise, such multiple modes may be enabled to improve energy efficiency. In this regard, FIG. 1B illustrates a radio frequency (RF) mobile terminal 20. The mobile terminal 20 may be a cellular telephone, smart phone, pager, or the like. The mobile terminal 20 may include a receiver 22, an RF transmitter 24, an antenna 26, a switch 28, a baseband processor 30, a control system 32, a frequency synthesizer 34, and a user interface 36.

With continued reference to FIG. 1B, the receiver 22 receives an information-bearing RF signal from one or more remote transmitters provided by a base station (not shown). A low noise amplifier (LNA) 38 amplifies the signal. Filter 40 minimizes broadband interference in the received signal, while down conversion and digitization circuitry 42 down converts the filtered, received signal to an intermediate or baseband frequency signal, which is then digitized into one or more digital streams. The receiver 22 typically uses one or more mixing frequencies generated by the frequency synthesizer 34. The baseband processor 30 processes the digitized received signal to extract the information or data bits conveyed in the signal. As such, the baseband processor 30 is typically implemented in one or more digital signal processors (DSPs).

With continued reference to FIG. 1B, on the transmit side, the baseband processor 30 receives digitized data, which may represent voice, data, or control information, from the control system 32, which it encodes for transmission. The encoded data is output to the RF transmitter 24, where it is used by a modulator 44 to modulate a carrier signal at a desired transmit frequency. RF power amplifier 46 amplifies the modulated carrier signal to a level appropriate for transmission, and delivers the amplified and modulated carrier signal to the antenna 26 through the switch 28.

With continued reference to FIG. 1B, a user may interact with the mobile terminal 20 via the user interface 36, which may include interface circuitry 48 associated with a microphone, a speaker, a keypad, and a display. The interface circuitry 48 typically includes analog-to-digital converters, digital-to-analog converters, amplifiers, and the like. Additionally, it may include a voice encoder/decoder, in which case it may communicate directly with the baseband processor 30. Audio information encoded in the received signal is recovered by the baseband processor 30, and converted by the interface circuitry 48 into an analog signal suitable for driving the speaker. The keypad and display enable the user to interact with the mobile terminal 20. For example, the keypad and display may enable the user to input numbers to be dialed, access address book information, or the like, as well as monitor call progress information.

In practice, the mobile terminal 20 may have one or more ICs for different functions of the mobile terminal 20. For example, the switch 28 may be one IC, the receiver 22 another IC, the baseband processor 30 a third IC, the RF transmitter 24 a fourth IC, and the interface circuitry 48 a fifth IC. Each of the various ICs may have multiple operating modes, which may include respective voltage conditions. Accordingly, devices like the mobile terminal 20, and in particular, the ICs therein, may benefit from exemplary aspects of the present disclosure.

It should be appreciated that different voltage conditions may create different delays among clocked elements as more time may be used in crossing threshold voltages. Different delays may disrupt the carefully generated clock tree and introduce unwanted clock skew into the IC. In some computing devices, a second clock tree is used to make sure that the clock skew remains minimized across multiple voltage conditions.

Figure 2A:
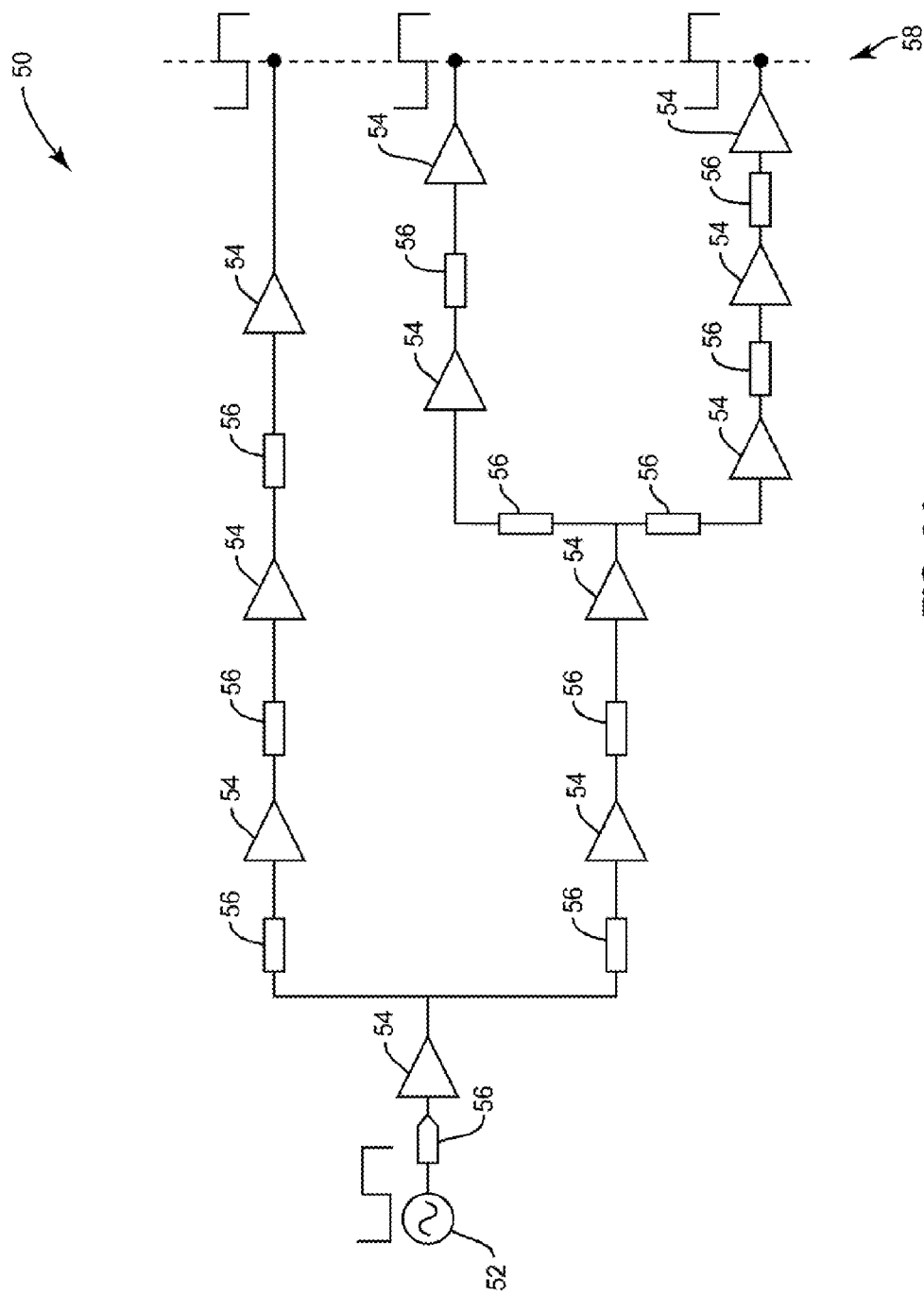
FIGS. 2A and 2B are simplified diagrams of two clock trees that may be concurrently used in an IC to accommodate different voltage conditions.

In this regard, FIG. 2A illustrates a first clock tree 50 that may be appropriate for use in an IC at comparatively high voltages (i.e., a high voltage constraint). As used herein, a high voltage is a supply voltage, which is greater than approximately 0.9 volts. The first clock tree 50 may include a clock 52 with multiple drivers 54. As used herein, a "driver" is a logical block that could also have additional signals combined with the clock signal to produce a modified clock output signal. In this manner, the drivers 54 are clocked elements within the first clock tree 50. In some instances, the drivers 54 may be delay elements. The drivers 54 are connected by wires 56. The wires 56 are relatively short and the drivers 54 are relatively small compared to those used in a lower voltage, lower frequency mode. By making the drivers 54 relatively small and the wires 56 relatively short, clock skew (denoted by line 58) is minimized. Further, note that while the first clock tree 50 is appropriate to minimize clock skew in the IC at high voltage conditions, the first clock tree 50 may be incapable of minimizing clock skew for the IC at low voltage conditions.

Figure 2B:
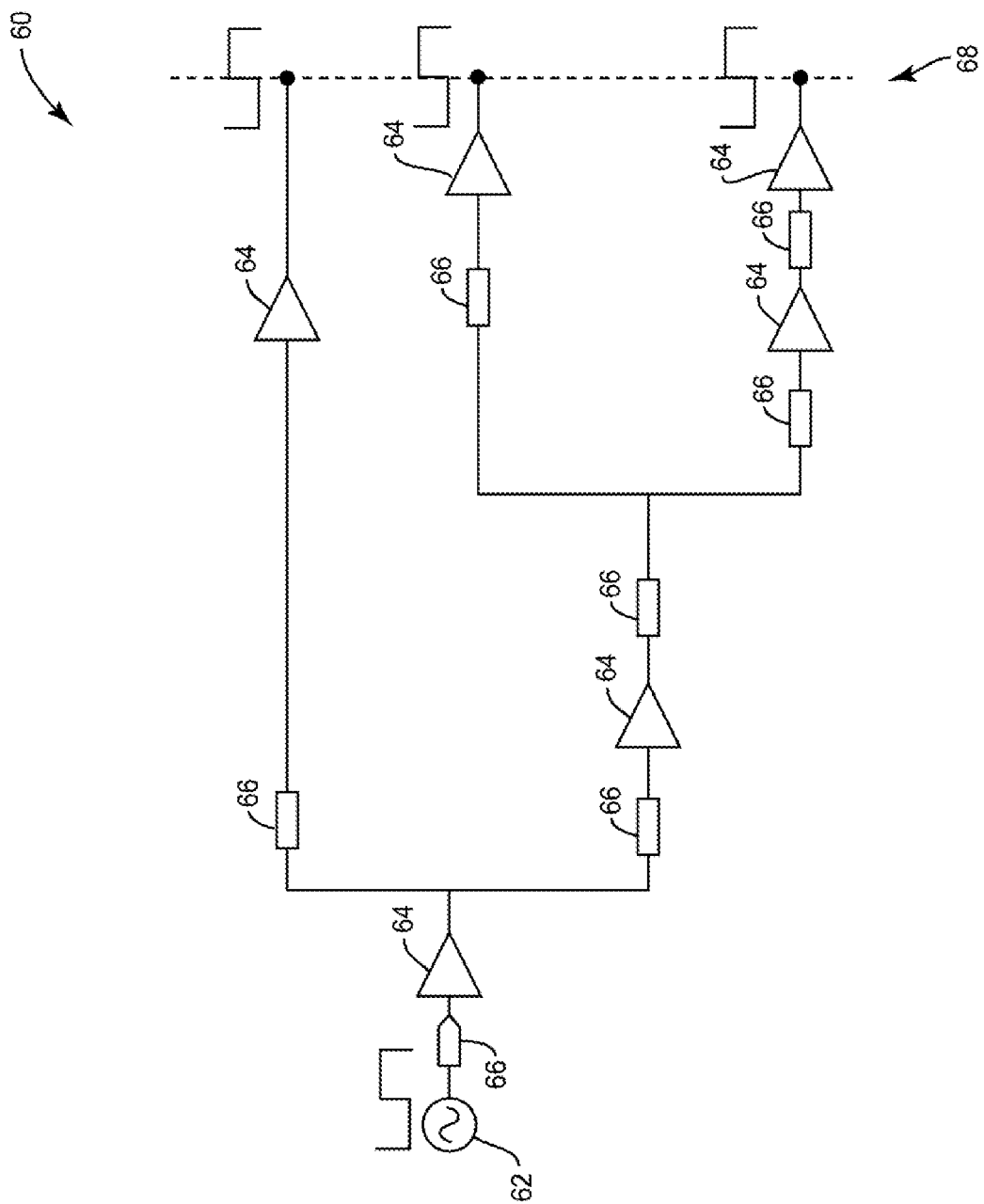

In contrast, FIG. 2B illustrates a second clock tree 60 that may be appropriate for use in an IC at comparatively low voltages (i.e., a low voltage constraint). As used herein, a low voltage is a supply voltage, which is approximately 500-600 mV. The second clock tree 60 may include a clock 62 with multiple drivers 64. As with the drivers 54 of FIG. 2A, the drivers 64 are clocked elements as that term is used herein. The drivers 64 are connected by wires 66. The wires 66 are relatively long and the drivers 64 are relatively large compared to those used in a higher voltage, higher frequency mode (e.g., those used in the optimized first clock tree 50). By making the drivers 64 relatively large and the wires 66 relatively long, the number of the drivers 64 in series and associated delay variation is reduced, and clock skew (denoted by line 68) is minimized. While the second clock tree 60 may be appropriate for use at low voltages, the second clock tree 60 may be incapable of minimizing clock skew for the IC at high voltage conditions.

To minimize clock skew at both operating conditions, a circuit designer could create an IC that uses both the first clock tree 50 and the second clock tree 60. While using both the first clock tree 50 and the second clock tree 60 in a single IC allows the IC to operate in multiple voltage conditions without changing the clock skew, it should be appreciated that using multiple clock trees (e.g., the first clock tree 50 and the second clock tree 60) is expensive and consumes space. Commercial pressure makes such expensive ICs undesirable. Likewise, space, especially in mobile computing devices, is at a premium.

Exemplary aspects of the present disclosure help avoid having to use two separate clock trees (e.g., the first clock tree 50 and the second clock tree 60) with bypassable clocked elements that may be selectively bypassed depending on the voltage condition of the IC. Thus, in an exemplary aspect, in a low power mode, short wires and small drivers (i.e., clocked elements) are bypassed in favor of fewer large drivers and longer wires. In contrast, in a high power mode, the large drivers are bypassed and additional small drivers are used with short wires. Bypassing clocked elements depending on voltage constraints allows for the clock skew to be minimized across a wide range of voltage constraints. In an exemplary aspect, differing elements are bypassed in different ones of the two modes. In another exemplary aspect, elements are only bypassed in one of the modes. In a further exemplary aspect, there are more than two modes, and differing elements may be bypassed in one or more of the modes including, possibly, each mode having a bypassed element.

Figure 3:
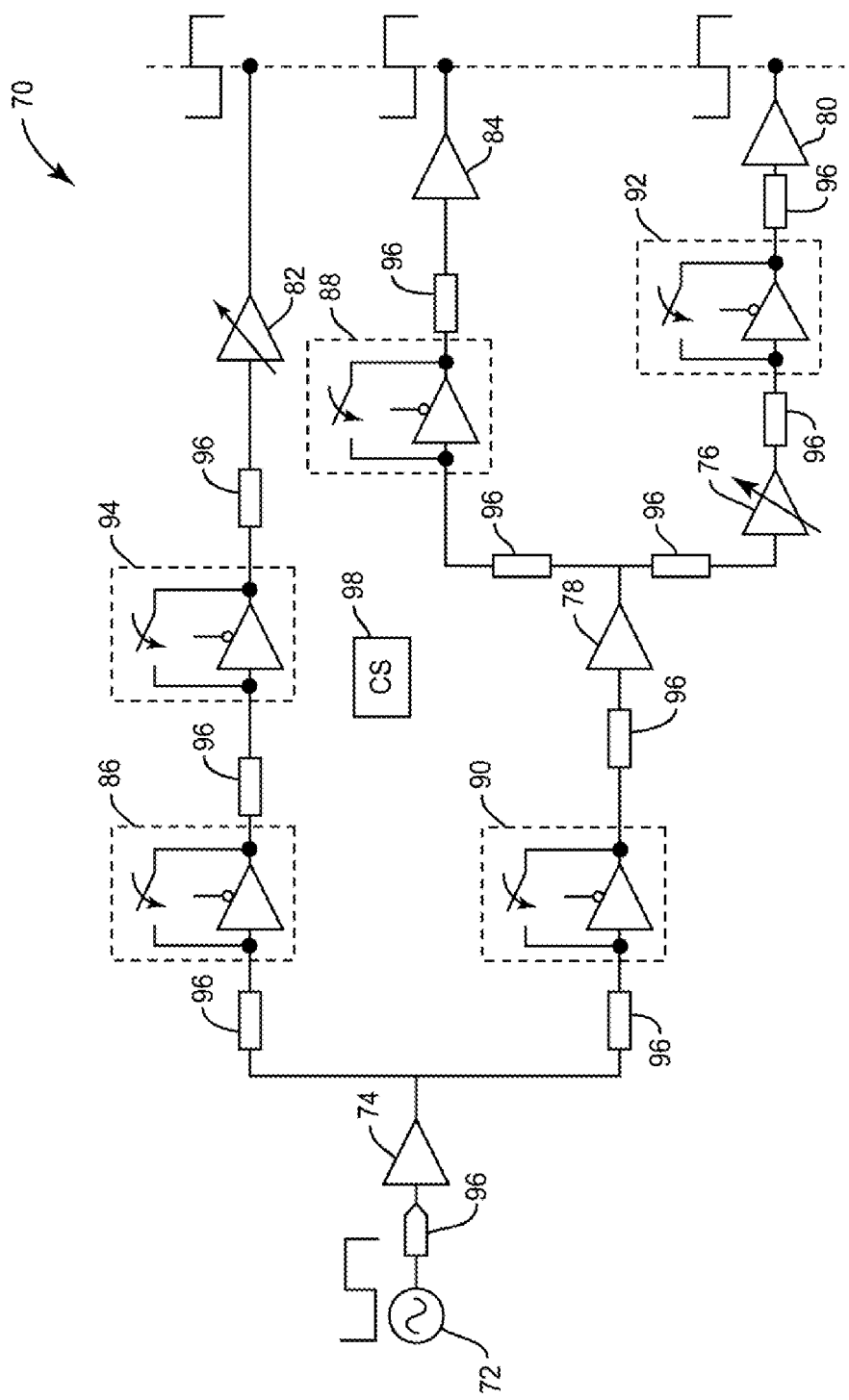
FIG. 3 illustrates a combined clock tree with bypassable elements capable of operating under plural voltage conditions according to an exemplary aspect of the present disclosure.

In this regard, FIG. 3 illustrates a combined clock tree 70 that effectively combines the first clock tree 50 of FIG. 2A and the second clock tree 60 of FIG. 2B by using bypassable clocked elements that are bypassed depending on an operational state of the IC or computing device. In particular, the combined clock tree 70 includes a root clock 72 with clocked elements 74, 76, 78, 80, 82, and 84. Additionally, the combined clock tree 70 includes bypassable clocked elements 86, 88, 90, 92, and 94. It should be appreciated that wires 96 interconnect the clocked elements 74, 76, 78, 80, 82, and 84 with the clock 72 and the bypassable clocked elements 86, 88, 90, 92, and 94. A control system (labeled CS in FIG. 3) 98 is also associated with the combined clock tree 70 and controls the bypassable clocked elements 86, 88, 90, 92, and 94 depending on an operational state of the IC in which the combined clock tree 70 is operating.

With continuing reference to FIG. 3, if the bypassable clocked elements 86, 88, 90, 92, and 94 are not bypassed, the combined clock tree 70 includes all the clocked elements of the first clock tree 50. In contrast, if the bypassable clocked elements 86, 88, 90, 92, and 94 are bypassed, the combined clock tree 70 essentially includes only the clocked elements of the second clock tree 60. Thus, in a first operational state (e.g., a high voltage condition), the bypassable clocked elements 86, 88, 90, 92, and 94 are not bypassed and the IC effectively has the use of the first clock tree 50 with minimal clock skew. In a second operational state, (e.g., a low voltage condition), the control system 98 causes the bypassable clocked elements 86, 88, 90, 92, and 94 to be bypassed, and the IC effectively has the use of the second clock tree 60 with minimal clock skew. In an exemplary aspect, the clocked elements 76 and 82 include variable drivers that may be positioned downstream of the bypassable clocked elements 86, 88, 90, 92, or 94 and may adjust impedance or otherwise compensate for changes that occur when the bypassable clocked elements 86, 88, 90, 92, and 94 are bypassed in the second operational state.

It should be appreciated that while FIG. 3 is directed to a combined clock tree 70 that may be positioned in a two-dimensional or a three-dimensional IC and may operate under two voltage conditions, the present disclosure is not so limited. Combined clock trees that handle plural voltage conditions or operational states are also possible. In such instances, each of the operational states may selectively bypass one or more clocked elements. Some clocked elements may be bypassed in multiple ones of the plural operational states while other clocked elements are active in all of the operational states. As alluded to above, in an exemplary aspect, it is possible that in a first mode a first clocked element is bypassed while a second clocked element is active, and in a second mode, the IC is reconfigured such that the second clocked element is bypassed while the first clocked element is active. That is, each mode may have bypassed clocked elements as needed to optimize the clock tree and make the wiring layout operate according to the needs of the circuit.

It should be appreciated that there are multiple techniques to form the bypassable clocked elements 86, 88, 90, 92, and 94. In this regard, FIGS. 4A and 4B illustrate two such techniques. In particular, FIG. 4A illustrates bypassable clocked element 90' with the understanding that the structure of the bypassable clocked element 90' may be used for the bypassable clocked elements 86, 88, 90, 92 and/or 94. The bypassable clocked element 90' has a driver 100, an input 102, and an output 104. The input 102 and the output 104 are coupled by a short circuit path 106, formed by an input side 106A and an output side 106B with a switch 108 selectively providing an electrical connection between the input side 106A and the output side 106B. When the switch 108 is closed, a short circuit exists, effectively bypassing the driver 100. The control system 98 of FIG. 3 signals the opening and closing of the switch 108 and provides a control signal on a control line 110 to the driver 100 to power down the driver 100 when the switch 108 is closed. By going into a low power mode for the driver 100 when the switch 108 is closed, power may be conserved, which may extend battery life.

FIG. 4B illustrates a second, more detailed technique to form bypassable clocked element 92'. It should be understood that similar structures may exist for the bypassable clocked elements 86, 88, 90, 92, and/or 94. The bypassable clocked element 92' has a driver 112, an input 114, and an output 116. The input 114 and the output 116 are coupled by a short circuit path 118, formed by an input side 118A and an output side 118B with a switch 120 selectively providing an electrical short between the input side 118A and the output side 118B. The switch 120 may be formed by two field effect transistors (FETs) 120A and 120B and two metal oxide semiconductor FETs (MOSFETs) 120C and 120D. The MOSFETs 120C and 120D are controlled by a voltage boost circuit and switch control logic 122. The voltage boost circuit and switch control logic 122 receives a signal from a mode decoder 124 that causes the voltage boost circuit and switch control logic 122 to open or close the switch 120 depending on what operational state is active. The mode decoder 124 receives an indication of the operational state from the control system 98 (FIG. 3). The mode decoder 124 also controls a driver control logic 126 that uses a control line 128 to power down the driver 112 when the switch 120 is closed. As with the bypassable clocked element 90' of FIG. 4A, by going into a low power mode for the driver 112 when the switch is closed, power may be conserved. Still other structures and/or circuits may be used for the bypassable clocked elements 86, 88, 90, 92, and 94.

Figure 5:
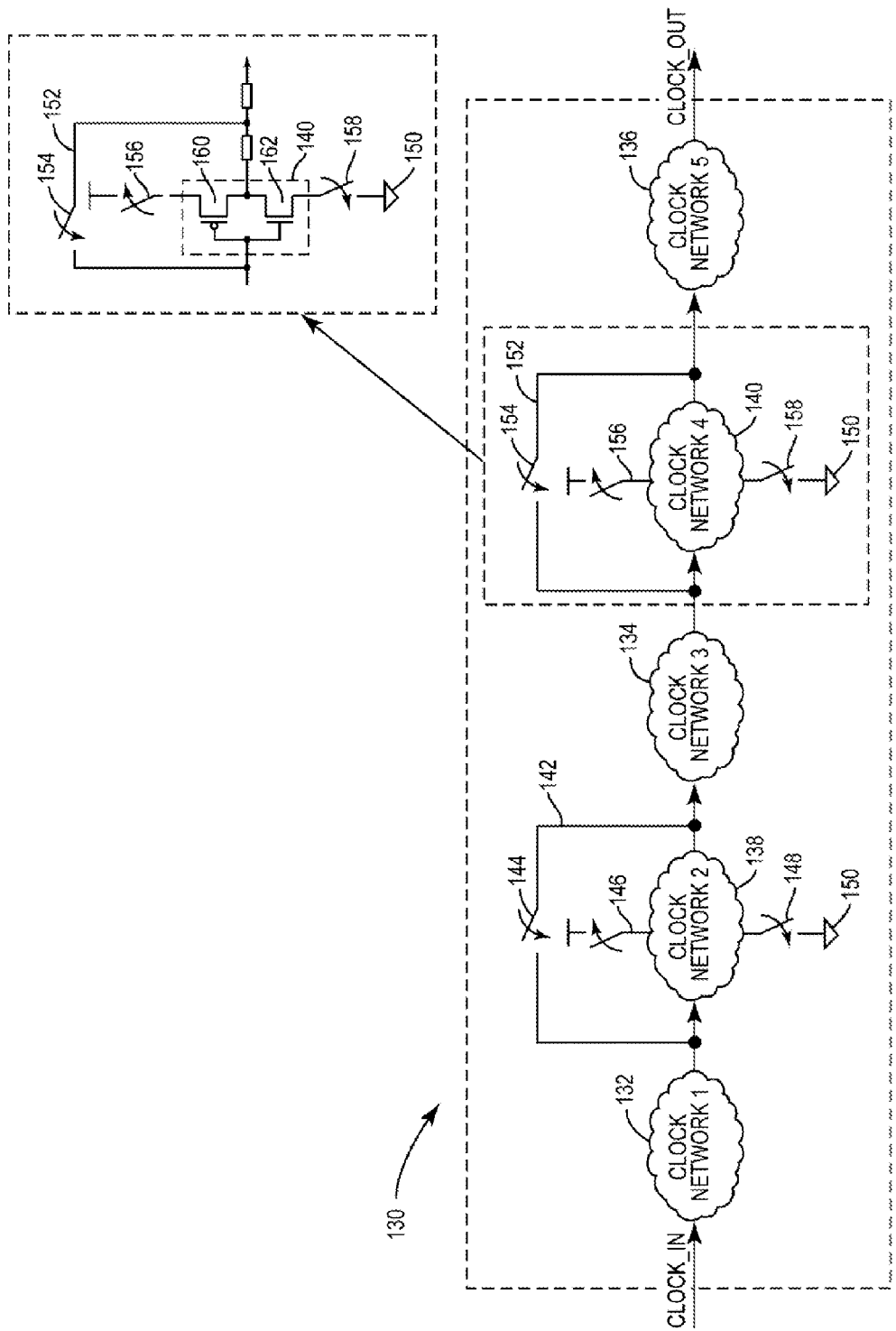
FIG. 5 illustrates a clock tree with bypassable clocked networks according to an exemplary aspect of the present disclosure.

While FIGS. 3, 4A, and 4B assume that the difference in the combined clock tree 70 between different operational states is the addition or removal of a clocked element, exemplary aspects of the present disclosure are not so limited. Entire clock networks may be removed based on which operational state is active. In this regard, FIG. 5 illustrates a clock tree 130 with clock networks 132, 134, and 136, as well as bypassable clocked networks 138 and 140 according to an exemplary aspect of the present disclosure. The bypassable clocked network 138 is associated with a bypass path 142 that provides a short circuit around the bypassable clocked network 138 when a switch 144 is closed. A power signal (not shown) is selectively provided through a switch 146 to the bypassable clocked network 138. When the switch 144 is closed, the switch 146 is opened, and the bypassable clocked network 138 enters a low power state. A switch 148 is provided to couple elements of the bypassable clocked network 138 to ground 150 when the switch 144 is open. The switches 144, 146, and 148 are controlled by the control system 98 (FIG. 3), although additional logic circuits may also be present.

With continued reference to FIG. 5, the bypassable clocked network 140 is associated with a bypass path 152 that provides a short circuit around the bypassable clocked network 140 when a switch 154 is closed. A power signal (not shown) is selectively provided through a switch 156 to the bypassable clocked network 140. When the switch 154 is closed, the switch 156 is opened, and the bypassable clocked network 140 enters a low power state. A switch 158 is provided to couple elements of the bypassable clocked network 140 to ground 150 when the switch 154 is open. The switches 154, 156, and 158 are controlled by the control system 98 (FIG. 3), although additional logic circuits may also be present.

With continued reference to FIG. 5, the inset illustrates an expanded view of exemplary elements within the bypassable clocked network 140. The bypassable clocked network 140 includes two MOSFETS 160 and 162 as illustrated. It should be appreciated that the bypassable clocked networks 138 and 140 may include other elements without departing from the scope of the present disclosure.

Figure 6:
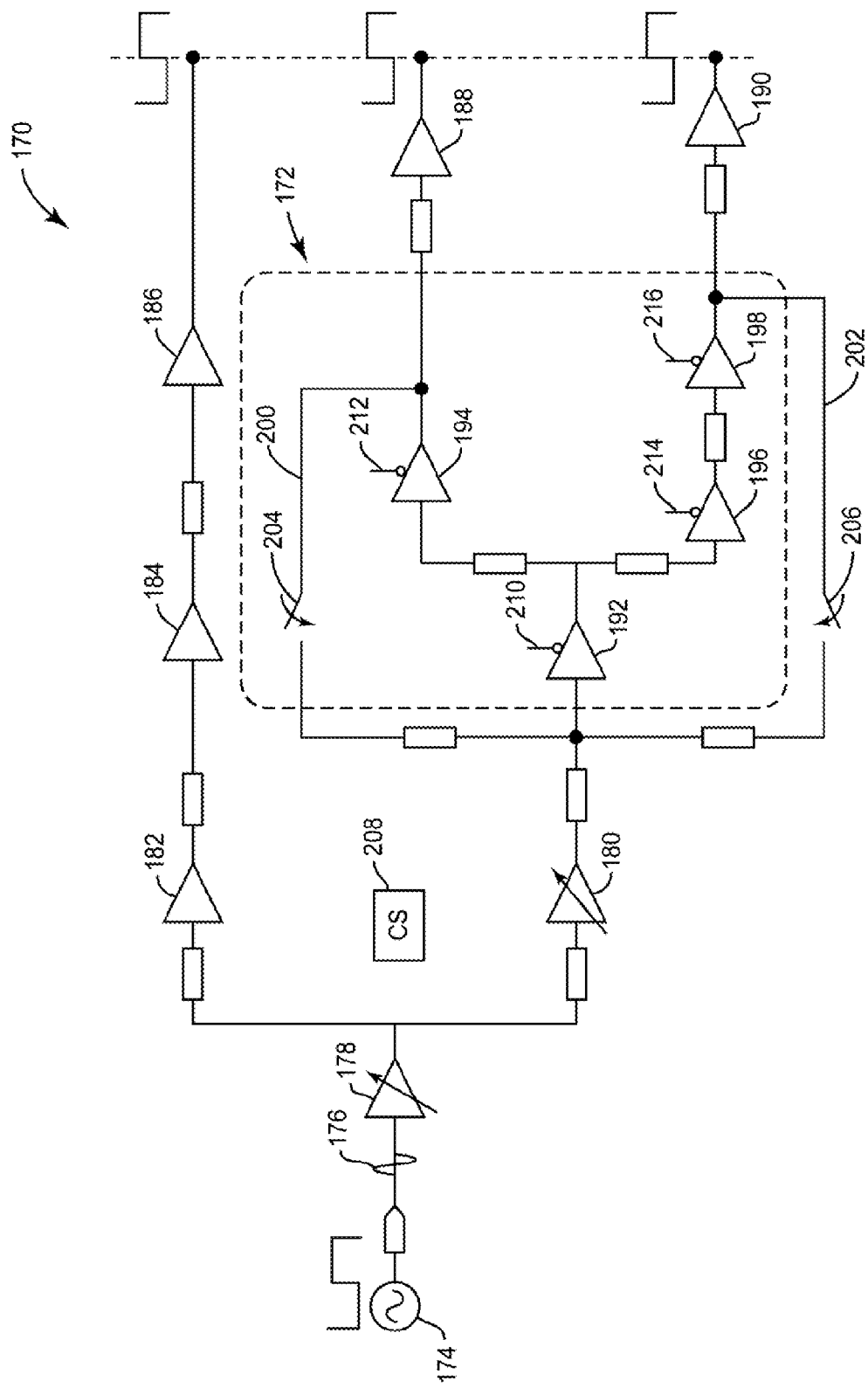
FIG. 6 illustrates a combined clock tree with a bypassable clocked cell according to an exemplary aspect of the present disclosure.

The above discussion has presented bypassable clocked elements and bypassable clocked networks. As used herein, both bypassable clocked elements and bypassable clocked networks are bypassable clocked cells. As used herein, "clocked cells" do not have to be a single element (e.g., a delay element or driver) or a whole network (e.g., the bypassable clocked network 138 of FIG. 5). In this regard, FIG. 6 illustrates a combined clock tree 170 with a bypassable clocked cell 172 according to an exemplary aspect of the present disclosure. The combined clock tree 170 is capable of operating in plural operational states, each of which corresponds to different voltage conditions. The combined clock tree 170 includes a clock 174 that provides a clock signal 176 to variable drivers 178 and 180, and other drivers 182, 184, 186, 188, and 190, as well as the bypassable clocked cell 172. The bypassable clocked cell 172 includes drivers 192, 194, 196, and 198. The bypassable clocked cell 172 further includes bypass lines 200 and 202. The bypass line 200 includes a switch 204, and the bypass line 202 includes a switch 206. When the switches 204 and 206 are closed, a short circuit is formed, which bypasses the drivers 192, 194, 196, and 198. The switches 204 and 206 are controlled by a control system (also labeled CS) 208. The control system 208 further uses control lines 210, 212, 214, and 216 to cause the drivers 192, 194, 196, and 198 respectively to power down. By simultaneously bypassing the drivers 192, 194, 196, and 198 while powering down the drivers 192, 194, 196, and 198, power may be conserved. The control system 208 responds to changes in the operational state by determining whether to bypass the bypassable clocked cell 172 and then issuing the appropriate commands to the switches 204 and 206 and the control lines 210, 212, 214, and 216. By removing the clocked elements (i.e., the drivers 192, 194, 196, and 198), clock skew may be minimized for certain operational states.

Against the backdrop of FIGS. 1-6, FIG. 7 illustrates a flowchart for an exemplary process 220 for operating a clock tree with bypassable elements. The process 220 begins by providing a combined clock tree in an IC (block 222). The combined clock tree can include bypassable clocked elements, such as the bypassable clocked elements 86, 88, 90, 92, or 94 of FIG. 3, bypassable clocked networks, such as the bypassable clocked networks 138 or 140 of FIG. 5, or more generically bypassable clocked cells, such as the bypassable clocked cell 172 of FIG. 6. The control system of the IC (e.g., the control system 98 or 208) determines a first operational state with a corresponding first voltage condition (block 224). The first voltage condition may be a high voltage condition or a low voltage condition or one of a plurality of possible voltage conditions. The control system of the IC turns on and off bypassable clocked cells to use a first clock tree configuration to minimize clock skew for the IC for the first voltage condition (block 226).

Figure 7:
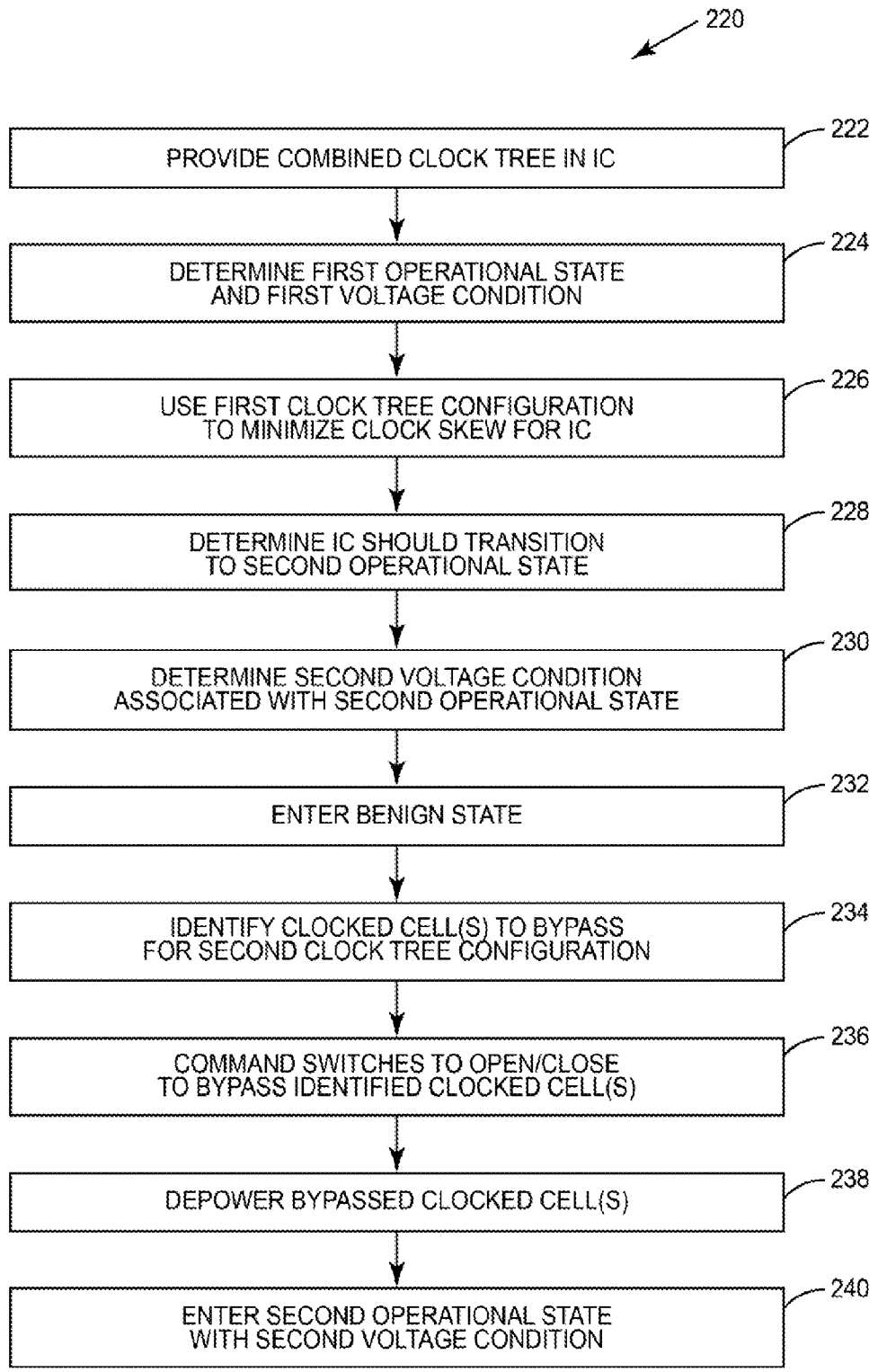
FIG. 7 is a flowchart illustrating an exemplary process for operating a clock tree with bypassable elements.

With continued reference to FIG. 7, the control system of the IC determines that the IC should transition to a second operational state (block 228). This determination may be the result of an instruction to enter a low-power state. The instruction may be generated by the control system of the IC or received from an external source. In either event, the control system of the IC determines a second voltage condition associated with the second operational state (block 230). The control system of the IC forces the IC into a benign state (block 232). The benign state allows clock tree reconfiguration without loss of data or risk of damage to elements within the clock tree.

With continued reference to FIG. 7, the control system of the IC identifies one or more clocked cells to bypass for a second clock tree configuration (block 234). The control system of the IC issues commands to the appropriate switches to open or close to bypass the identified clocked cell(s) (block 236). Likewise, clocked cells that are no longer to be bypassed have the respective switches thrown so that the clocked cells are reinserted into the clock tree. The control system of the IC further issues commands to depower any bypassed clocked cell(s) (block 238). Additionally, the control system of the IC may cause any variable drivers to be adjusted so as to accommodate the second clock tree configuration. As noted above, such adjustments may include impedance adjustments or other adjustments to accommodate the presence or absence of upstream clocked elements. Once all the changes are made and settled, the control system of the IC can cause the IC to enter the second operational state with the second voltage condition (block 240).

The clock distribution schemes with wide operating voltage ranges according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
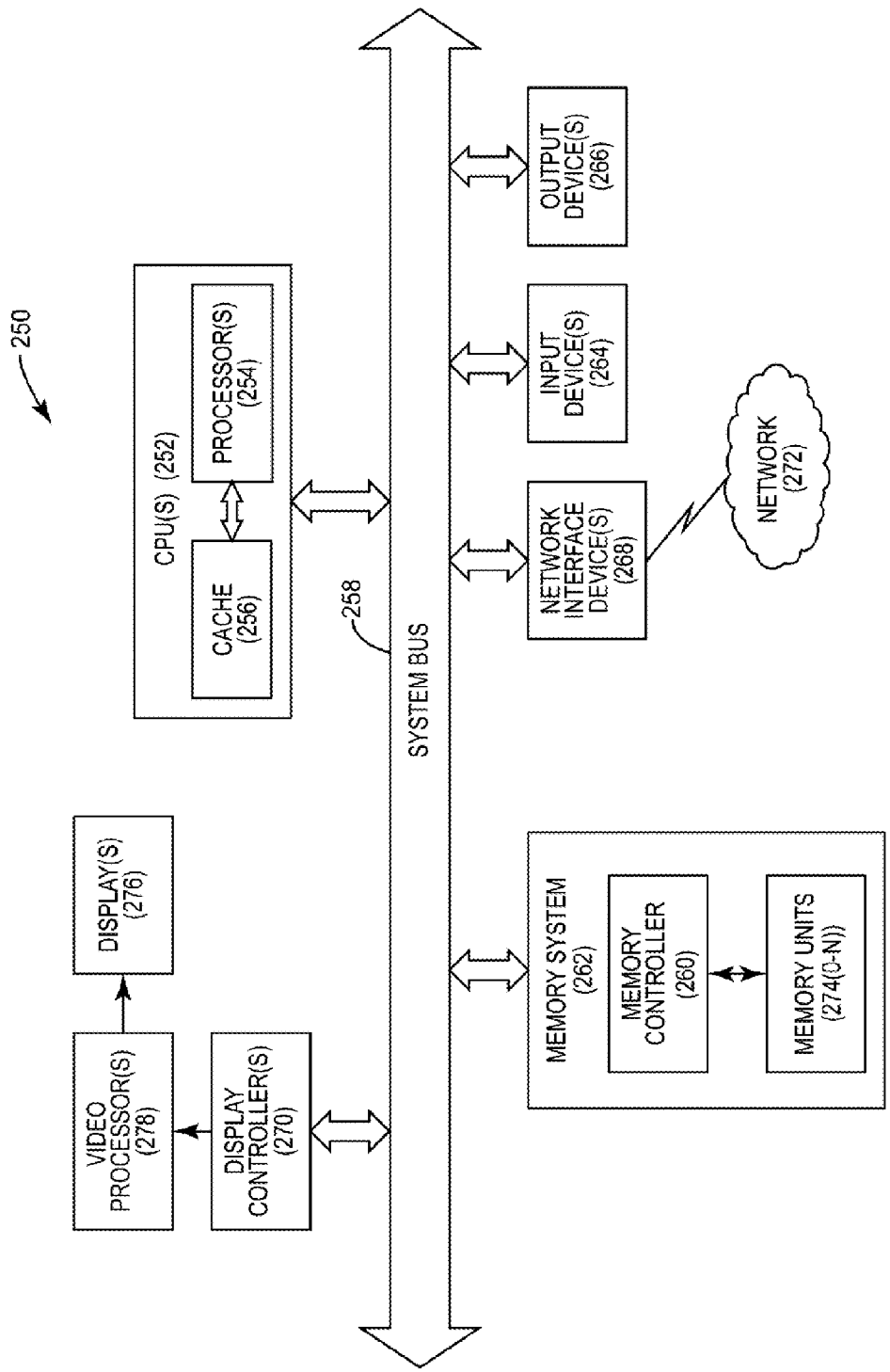
FIG. 8 is a block diagram of an exemplary processor-based system that can include clock trees with bypassable clock elements.

In this regard, FIG. 8 illustrates an example of a processor-based system 250 that can employ the combined clock tree 70, 130 or 170 illustrated in FIG. 3, 5, or 6. In this example, the processor-based system 250 includes one or more central processing units (CPUs) 252, each including one or more processors 254. The CPU(s) 252 may have cache memory 256 coupled to the processor(s) 254 for rapid access to temporarily stored data. The CPU(s) 252 is coupled to a system bus 258 and can intercouple devices included in the processor-based system 250. As is well known, the CPU(s) 252 communicates with these other devices by exchanging address, control, and data information over the system bus 258. For example, the CPU(s) 252 can communicate bus transaction requests to a memory controller 260. Although not illustrated in FIG. 8, multiple system buses 258 could be provided.

Other devices can be connected to the system bus 258. As illustrated in FIG. 8, these devices can include a memory system 262, one or more input devices 264, one or more output devices 266, one or more network interface devices 268, and one or more display controllers 270, as examples. The input device(s) 264 can include any type of input device, including, but not limited to, input keys, switches, voice processors, etc. The output device(s) 266 can include any type of output device, including, but not limited to, audio, video, other visual indicators, etc. The network interface device(s) 268 can be any device configured to allow exchange of data to and from a network 272. The network 272 can be any type of network, including but not limited to a wired or wireless network, a private or public network, a local area network (LAN), a wireless local area network (WLAN), a wide area network (WAN), a BLUETOOTH™ network, and the Internet. The network interface device(s) 268 can be configured to support any type of communications protocol desired. The memory system 262 can include one or more memory units 274(0-N).

The CPU(s) 252 may also be configured to access the display controller(s) 270 over the system bus 258 to control information sent to one or more displays 276. The display controller(s) 270 sends information to the display(s) 276 to be displayed via one or more video processors 278, which process the information to be displayed into a format suitable for the display(s) 276. The display(s) 276 can include any type of display, including, but not limited to, a cathode ray tube (CRT), a liquid crystal display (LCD), a light emitting diode (LED) display, a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of controlling a clock tree within a computing device, comprising:
   determining, using a control system within the computing device, a first voltage condition of an integrated circuit (IC) device within the computing device from among a plurality of voltage conditions;
   while the first voltage condition is valid, using a first clock tree configuration to minimize clock skew for a clock tree of the IC device;
   determining, using the control system within the computing device, a second voltage condition from among the plurality of voltage conditions;
   bypassing a clocked cell within the clock tree to generate a second clock tree configuration while in the second voltage condition;
   adjusting a variable driver downstream of the bypassed clocked cell in the second voltage condition; and
   depowering the clocked cell while in the second voltage condition.

2. The method of claim 1, further comprising identifying the clocked cell to be bypassed in the second voltage condition.

3. The method of claim 1, wherein the first voltage condition is a higher voltage condition than the second voltage condition.

4. The method of claim 1, wherein the first voltage condition is a lower voltage condition than the second voltage condition.

5. The method of claim 1, wherein the clocked cell comprises a delay element.

6. The method of claim 1, wherein bypassing the clocked cell comprises bypassing the clocked cell with a switch.

7. The method of claim 6, wherein bypassing the clocked cell with the switch comprises providing a short circuit path around the clocked cell with the switch.

8. The method of claim 1, wherein bypassing the clocked cell comprises bypassing a plurality of clocked elements within the clocked cell.

9. The method of claim 1, further comprising placing the IC device into a first operational state to achieve the first voltage condition.

10. The method of claim 9, further comprising placing the IC device into a second operational state to achieve the second voltage condition.

11. The method of claim 10, further comprising placing the IC device into a benign state between the first operational state and the second operational state.

12. The method of claim 11, further comprising reconfiguring bypass elements while in the benign state.

13. An integrated circuit (IC) comprising:
    a clock tree formed from a plurality of clocked elements;
    at least one bypass switch associated with at least one of the plurality of clocked elements; and
    a control system operatively coupled to the at least one bypass switch, the control system configured to:
      control operation of the IC at a first voltage condition among a plurality of voltage conditions;
      while the first voltage condition is valid, use a first clock tree configuration to minimize clock skew for the clock tree of the IC;
      cause a transition to a second voltage condition from among the plurality of voltage conditions;
      cause the at least one bypass switch to bypass the at least one of the plurality of clocked elements when in the second voltage condition;
      adjust a variable driver downstream of the at least one of the plurality of clocked elements in the second voltage condition; and
      depower bypassed clocked elements while in the second voltage condition.

14. The IC of claim 13, wherein the IC comprises a two-dimensional IC.

15. The IC of claim 13, wherein the IC comprises a three-dimensional IC.

16. The IC of claim 13, wherein the at least one of the plurality of clocked elements comprises at least one delay element.

17. The IC of claim 13, further comprising the variable driver coupled to the control system, and the control system configured to adjust the variable driver depending on whether the IC is in the first voltage condition or the second voltage condition.

18. The IC of claim 13, wherein the control system is further configured to place the IC into a first operational state to achieve the first voltage condition.

19. The IC of claim 18, wherein the control system is further configured to place the IC into a second operational state to achieve the second voltage condition.

20. The IC of claim 19, wherein the control system is further configured to place the IC into a benign state between the first operational state and the second operational state.

21. The IC of claim 20, wherein the control system is further configured to reconfigure the bypassed clocked elements while in the benign state.

22. The IC of claim 13, further comprising a root clock associated with the clock tree.

23. The IC of claim 13 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

24. An integrated circuit (IC) comprising:
    a clock tree formed from a plurality of clocked elements;
    at least one means for bypassing at least one of the plurality of clocked elements; and a control system operatively coupled to the at least one means for bypassing, the control system configured to:
control operation of the IC at a first voltage condition among a plurality of voltage conditions;
while the first voltage condition is valid, use a first clock tree configuration to minimize clock skew for the clock tree of the IC;
cause a transition to a second voltage condition from among the plurality of voltage conditions;
cause the at least one means for bypassing to bypass the at least one of the plurality of clocked elements when in the second voltage condition;
adjust a variable driver downstream of the at least one of the plurality of clocked elements in the second voltage condition; and
depower bypassed clocked elements while in the second voltage condition.

* * * * *